United States Patent
Shinohara

(10) Patent No.: US 9,406,814 B2
(45) Date of Patent: Aug. 2, 2016

(54) NON-VOLATILE MEMORY DEVICE

(71) Applicant: Kabushiki Kaisha Toshiba, Minato-ku (JP)

(72) Inventor: Hiroshi Shinohara, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 8 days.

(21) Appl. No.: 14/202,470

(22) Filed: Mar. 10, 2014

(65) Prior Publication Data

US 2015/0035041 A1 Feb. 5, 2015

(30) Foreign Application Priority Data

Jul. 30, 2013 (JP) .................................. 2013-157586

(51) Int. Cl.
*H01L 29/792* (2006.01)
*H01L 27/115* (2006.01)

(52) U.S. Cl.
CPC ........ *H01L 29/7926* (2013.01); *H01L 27/1157* (2013.01); *H01L 27/11575* (2013.01); *H01L 27/11582* (2013.01)

(58) Field of Classification Search
CPC ............ H01L 29/7926; H01L 27/1157; H01L 27/11582
See application file for complete search history.

(56) References Cited

U.S. PATENT DOCUMENTS 8,008,710 B2   8/2011  Fukuzumi et al.
8,310,875 B2  11/2012  Sakurai et al.
2010/0038703 A1   2/2010  Fukuzumi et al.
2010/0213538 A1   8/2010  Fukuzumi et al.
2010/0232224 A1*  9/2010  Maeda et al. ............ 365/185.18
2012/0069660 A1*  3/2012  Iwai et al. ................ 365/185.11
2012/0069663 A1   3/2012  Itagaki et al.
2012/0182779 A1   7/2012  Fukuda

FOREIGN PATENT DOCUMENTS

JP  2010-199312 A  9/2010
JP    2012-69205 A  4/2012
JP    2012-69606 A  4/2012
JP    2012-69695 A  4/2012
JP   2012-151169 A  8/2012

* cited by examiner

*Primary Examiner* — Matthew Reames
*Assistant Examiner* — Vincent Wall
(74) *Attorney, Agent, or Firm* — Oblon, McClelland, Maier & Neustadt, L.L.P.

(57) ABSTRACT

According to one embodiment, a non-volatile memory device includes a first stacked electrode provided above a underlying layer, a second stacked electrode juxtaposed with the first stacked electrode above the underlying layer, a plurality of first semiconductor layers piercing the first stacked electrode in a direction perpendicular to the underlying layer, and a second semiconductor layer piercing the second stacked electrode in a direction perpendicular to the underlying layer. The device further includes a memory film provided between the first stacked electrode and the first semiconductor layers, and between the second stacked electrode and the second semiconductor layer, and a link part provided between the underlying layer and the first stacked electrode, and between the underlying layer and the second stacked electrode. The link part is electrically connected to one end of each of the first semiconductor layers and one end of the second semiconductor layer.

22 Claims, 8 Drawing Sheets

NON-VOLATILE MEMORY DEVICE

CROSS-REFERENCE TO RELATED APPLICATIONS

This application is based upon and claims the benefit of priority from Japanese Patent Application No. 2013-157586, filed on Jul. 30, 2013; the entire contents of which are incorporated herein by reference.

FIELD

Embodiments described herein relate generally to a non-volatile memory device.

BACKGROUND

Non-volatile memory devices as represented by NAND type flash memory are manufactured using semiconductor wafer processes. Also, the increase in capacity, the reduction in power consumption, and the reduction in cost have been achieved by progress in 2-dimensional microfabrication technology for wafer processes. However, massive equipment investment is required for further progress in microfabrication technology. Therefore, the development of memory devices with a 3-dimensional memory cell unit in which a plurality of memory layers is stacked is progressing.

BRIEF DESCRIPTION OF THE DRAWINGS

FIG. 3A to FIG. 7B are schematic cross-sectional views showing a process of manufacturing the memory cell array according to the embodiment;

DETAILED DESCRIPTION

Figure 1:
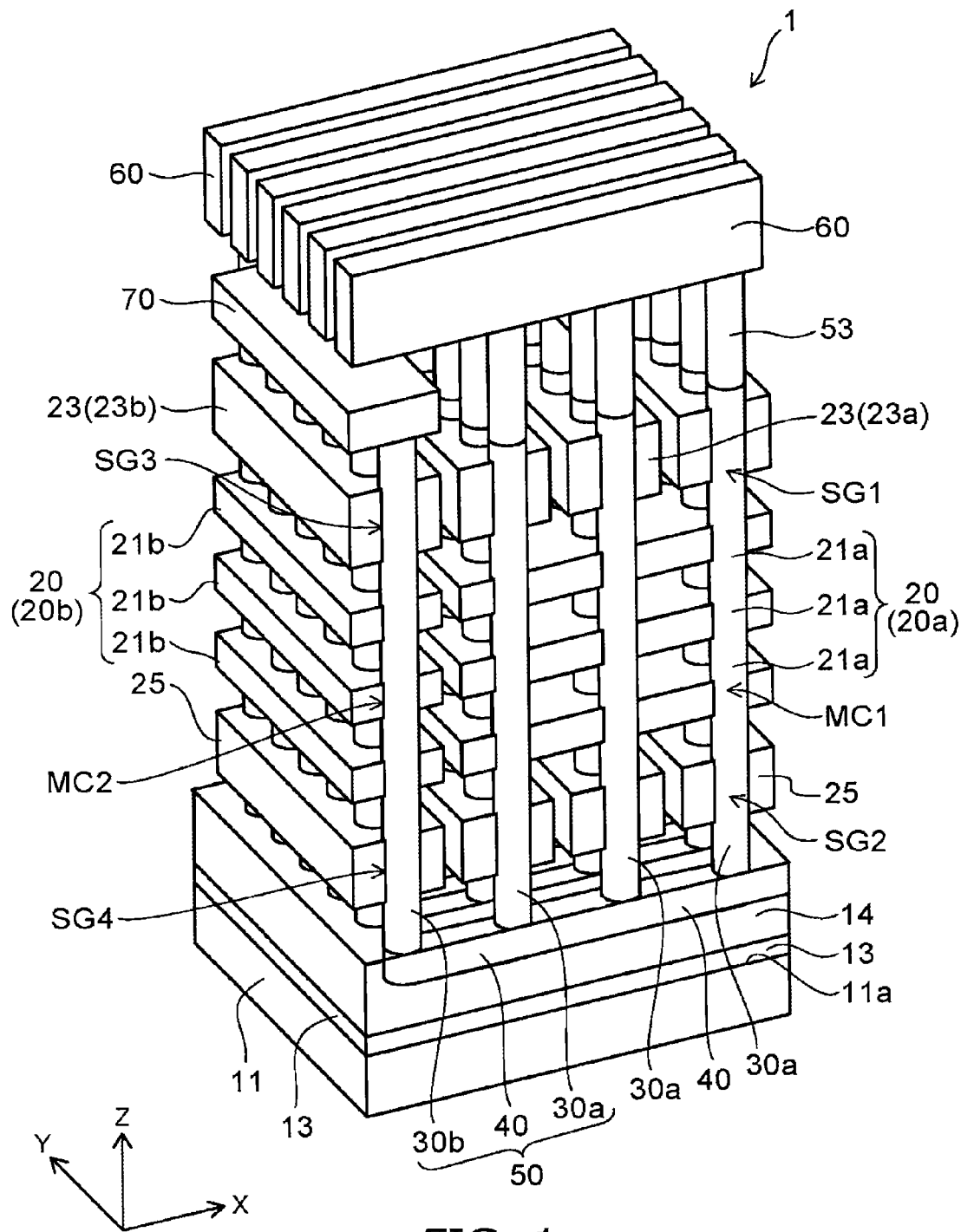
FIG. 1 is a perspective view schematically showing a non-volatile memory device according to an embodiment.

According to one embodiment, a non-volatile memory device includes a first stacked electrode provided above an underlying layer, a second stacked electrode juxtaposed with the first stacked electrode above the underlying layer, a plurality of first semiconductor layers piercing the first stacked electrode in a direction perpendicular to the underlying layer, and a second semiconductor layer piercing the second stacked electrode in a direction perpendicular to the underlying layer. The device further includes a memory film provided between the first stacked electrode and the first semiconductor layers, and between the second stacked electrode and the second semiconductor layer, and a link part provided between the underlying layer and the first stacked electrode, and between the underlying layer and the second stacked electrode. The link part is electrically connected to one end of each of the first semiconductor layers and one end of the second semiconductor layer. Another end of each of the first semiconductor layers is electrically connected to a first interconnection in common. Another end of the second semiconductor layer is electrically connected to a second interconnection. A first control electrode is provided between the first stacked electrode and the first interconnection. The first control electrode faces the first semiconductor layers via an insulating film to control ON and OFF states of electric conduction of the first semiconductor layers.

Various embodiments will be described hereinafter with reference to the accompanying drawings. The same numerals are applied to constituents that have already appeared in the drawings, and repetitious detailed descriptions of such constituents are omitted. Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

FIG. 1 is a perspective view schematically showing a non-volatile memory device according to the embodiment.

Figure 2:
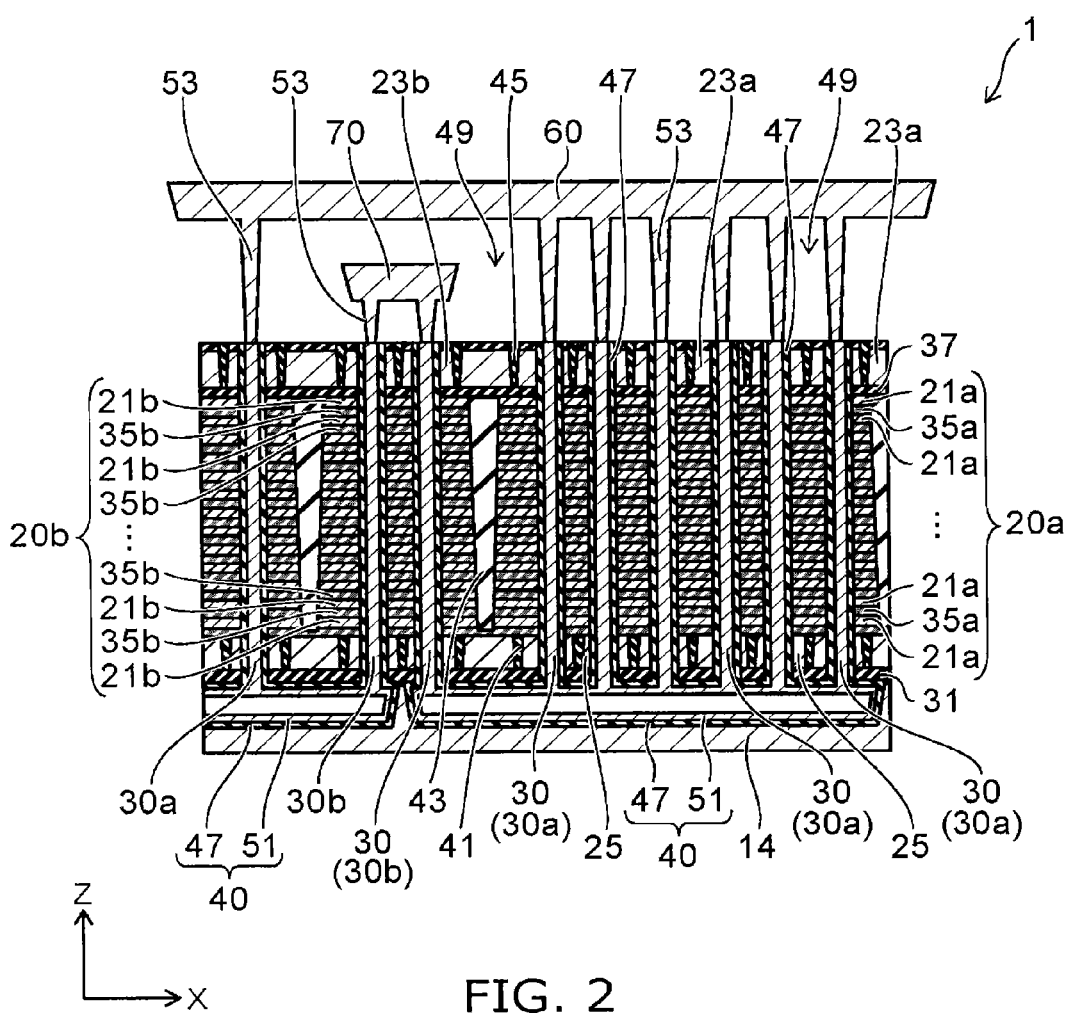
FIG. 2 is a cross-sectional view showing a memory cell array of the non-volatile memory device according to the embodiment.

FIG. 2 is a cross-sectional view showing a memory cell array 1 of the non-volatile memory device according to the embodiment.

The non-volatile memory device according to the embodiment is what is called NAND flash memory having the memory cell array 1 arranged three-dimensionally. FIG. 1 is a perspective view showing a portion of the memory cell array 1, and omits the display of insulating layers for easier understanding of the configuration. The individual elements of the memory cell array 1 are insulated from one another by the insulating layers (not shown).

As shown in FIG. 1, the non-volatile memory device includes the memory cell array 1 provided above an underlying layer.

The underlying layer is a substrate 11, for example. The substrate 11 is, for example, a silicon substrate having a top surface 11a on which a circuit that controls the memory cell array 1 is provided. A first interlayer insulating film (hereinafter, interlayer insulating film 13) is provided on the substrate 11. The memory cell array 1 is provided on the interlayer insulating film 13.

The memory cell array 1 includes a conductive layer 14 provided on an interlayer insulating film 13, a selection gate electrode 25 provided on the conductive layer 14, a stacked electrode 20 provided on the selection gate electrodes 25, a selection gate electrode 23 provided on the stacked electrode 20, and a first interconnection (hereinafter, bit lines 60) and a second interconnection (hereinafter, source line 70) that are provided on the selection gate electrode 23.

In the following description, a direction perpendicular to the substrate 11 is taken to be a Z-direction, one of two directions perpendicular to the Z-direction is taken to be an X-direction, and the other one of the two directions is taken to be a Y-direction. It should be noted that the Z-direction may be expressed as upward, and the direction opposite the Z-direction may be expressed as downward.

The stacked electrode 20 includes a first stacked electrode (hereinafter, stacked electrode 20a) and a second stacked electrode (hereinafter, stacked electrode 20b) that are juxtaposed above the underlying layer. The stacked electrode 20a includes a plurality of control gate electrodes 21a. The stacked electrode 20b includes a plurality of control gate electrodes 21b.

In the following description, the stacked electrode 20a and the stacked electrode 20b may be described in a distinguishable manner, and may be collectively described as the stacked electrode 20. The same is true of other elements.

The selection gate electrode 23 is provided in a stripe form to extend in the Y-direction. A plurality of selection gate electrodes 23a (first control electrodes) are juxtaposed on the stacked electrode 20a. The selection gate electrode 25 is likewise provided in a stripe form to extend in the Y-direction. A plurality of selection gate electrodes 25 (second control electrodes) are disposed between the conductive layer 14 and the stacked electrode 20a.

A selection gate electrode 23b (third control electrode) is provided on the stacked electrode 20b. The selection gate electrode 25 is also disposed between the conductive layer 14 and the stacked electrode 20b.

A plurality of first semiconductor layers (hereinafter, semiconductor layers 30a) are provided to pierce the selection gate electrode 25, the stacked electrode 20a and the selection gate electrode 23a in the Z-direction. A second semiconductor layer (hereinafter, semiconductor layer 30b) is provided to pierce the selection gate electrodes 25, the stacked electrode 20b and the selection gate electrode 23b in the Z-direction.

First ends of the plurality of semiconductor layers 30a and a first end of the semiconductor layer 30b are electrically connected to a link part 40. The link part 40 is provided between the conductive layer 14 and the selection gate electrodes 25 to electrically connect the plurality of semiconductor layers 30a and the semiconductor layer 30b.

Second ends of the plurality of semiconductor layers 30a connected to the single link part 40 are electrically connected to the single first interconnection (bit lines 60) via contact plugs 53, respectively. A second end of the semiconductor layer 30b is electrically connected to the second interconnection (source line 70) via a contact plug 53.

A memory film 47 (see FIG. 2) is provided on the outer surfaces of the semiconductor layers 30a and 30b, and the link parts 40. The memory film 47 is a multilayer film including, for example, a silicon oxide film and a silicon nitride film. The memory film 47 provided on the link parts 40 electrically insulates the link parts 40 from the conductive layer 14.

The memory film 47 provided between the semiconductor layers 30a and the control gate electrodes 21a serves as a charge storage layer. That is, memory cells MC1 are formed between the individual control gate electrodes 21a and the semiconductor layer 30a.

The memory film 47 provided between the semiconductor layers 30b and the control gate electrodes 21b also serves as a charge storage layer. Therefore, memory cells MC2 are likewise formed between the semiconductor layer 30b and the individual control gate electrodes 21b.

The memory film 47 provided between the selection gate electrode 23a provided on the stacked electrode 20a and the semiconductor layers 30a, and the memory film 47 provided between the selection gate electrode 25 and the semiconductor layers 30a serve as gate insulating films. A selection transistor SG1 is formed between the selection gate electrode 23a and the semiconductor layer 30a. A selection transistor SG2 is formed between the selection gate electrode 25 and the semiconductor layer 30a.

The memory film 47 provided between the selection gate electrode 23b provided on the stacked electrode 20b and the semiconductor layers 30b serves as a gate insulating film. A selection transistor SG3 is formed between the selection gate electrode 23b and the semiconductor layer 30b. A selection transistor SG4 is formed between the selection gate electrode 25 and the semiconductor layer 30b.

The selection transistors SG1 and SG3 are not limited to the example described above. Alternatively, SG1 and SG3 may include another insulating film replacing part of the memory film 47, for example.

The selection transistors SG1 and SG2 enable and disable electric conduction of the semiconductor layer 30a. The selection transistor SG3 enables and disables electric conduction of the semiconductor layer 30b.

According to the embodiment, one of a plurality of semiconductor layers 30a connected to the bit lines 60, the link part 40, and the semiconductor layer 30b connected to the source line 70 form a memory cell string 50. The selection transistor SG1 and the selection transistor SG3 control electric conduction of the memory cell string 50. The selection transistor SG2 disables conduction of a plurality of semiconductor layers 30a excluding the one that is set to ON state to prevent so-called read disturb. The selection transistor SG4 is kept to ON state.

As shown in FIG. 2, the semiconductor layer 30 is provided, for example, like a pillar extending in the Z-direction, and has an outer surface covered with the memory film 47. The link part 40 has a conductive layer 51 that is hollow, for example, and has the memory film 47 provided on the outer surface thereof. The semiconductor layer 30 and the conductive layer 51 include, for example, conductive polycrystalline silicon (polysilicon), and are electrically connected together.

The semiconductor layer 30 is provided inside a memory hole 65 piercing the selection gate electrode 23, the stacked electrode 20, and the selection gate electrode 25 as discussed later (see FIGS. 7A and 7B). For example, the semiconductor layer 30 is formed by depositing a polysilicon layer on the memory film 47 formed on the inner surface of the memory hole. The semiconductor layer 30 may have a pillar-like structure sealing the memory hole 65, or may have a hollow structure having a cavity inside.

The link part 40 has an outer surface covered with the conductive layer 14. That is, the conductive layer 51 is covered with the conductive layer 14 via the memory film 47. For example, when a predetermined voltage is applied to the conductive layer 51 with the conductive layer 14 serving as a back gate, a storage channel can be formed at the interface between the memory film 47 and the conductive layer 51. This makes it possible to enhance the conductivity of the conductive layer 51, and form the link part 40 long in the extending direction (X-direction). As a result, the number of the semiconductor layers 30a connectable to the link part 40 can be increased.

As shown in FIG. 2, an insulating layer 31 is provided on the conductive layer 14, and the selection gate electrodes 25 are provided on the insulating layer 31. The stacked electrodes 20a and 20b are juxtaposed on the selection gate electrodes 25.

The stacked electrode 20a includes a plurality of control gate electrodes 21a stacked in the Z-direction, and insulating layers 35a that electrically insulate between the control gate electrodes 21a. The stacked electrode 20b includes a plurality of control gate electrodes 21b stacked in the Z-direction, and insulating layers 35b that electrically insulate between the control gate electrodes 21b.

The control gate electrodes 21a and 21b are conductive polysilicon films, for example. The insulating layers 35a and 35b include at least one of a silicon oxide film and a silicon nitride film.

An insulating film 43 is provided between the stacked electrode 20a and the stacked electrode 20b to electrically insulate the stacked electrode 20a from the stacked electrode 20b. The insulating film 43 includes at least one of a silicon oxide film and a silicon nitride film.

The selection gate electrode 23 is provided on the stacked electrode 20a and the stacked electrode 20b. A multilayer interconnection including the bit lines 60 and the source lines 70 is provided on the selection gate electrode 23. The bit lines 60 are electrically connected via the contact plugs 53 to the semiconductor layer 30a piercing the selection gate electrode 23a. The source lines 70 are electrically connected via the contact plugs 53 to the semiconductor layer 30b piercing the selection gate electrode 23b.

A second interlayer insulating film (hereinafter, interlayer insulating film 49) is provided between the semiconductor layer 30a and the bit lines 60, and between the semiconductor layer 30b and the source lines 70. The plurality of contact plugs 53 piercing the interlayer insulating film 49 in the Z-direction causes the bit lines 60 to be electrically connected to the semiconductor layer 30a, and the source lines 70 to be electrically connected to the semiconductor layer 30b.

Referring now to FIG. 3A to FIG. 7B, a method of manufacturing the memory cell array 1 according to the embodiment is described. FIG. 3A to FIG. 7B are schematic cross-sectional views showing the process of manufacturing the memory cell array 1 according to the embodiment.

Figure 3A:
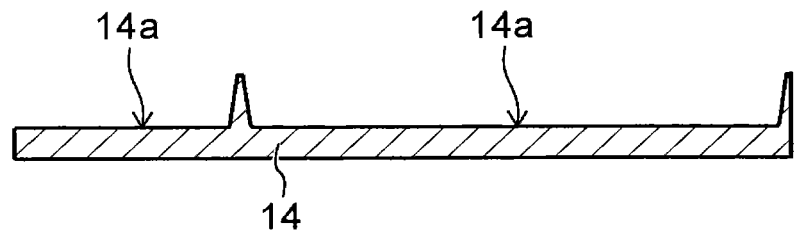

As shown in FIG. 3A, grooves (hereinafter, PC 14a) coupling the lower ends of the memory holes 65 are formed in the conductive layer 14 provided on the interlayer insulating film 13 (not shown). The conductive layer is, for example, a polysilicon film doped with boron as a p-type impurity.

Figure 3B:
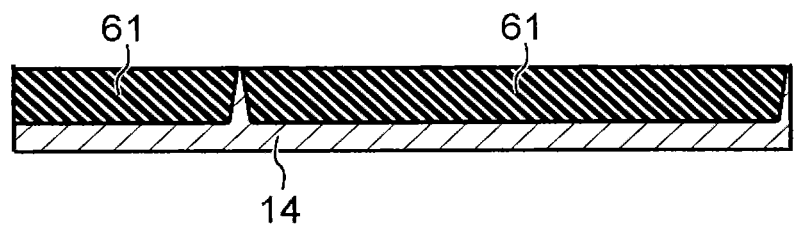

Next, as shown in FIG. 3B, a sacrificial layer 61 is embedded within the inside of the PC 14a. That is, the sacrificial layer 61 is deposited on the conductive layer 14 on which the PC 14a is formed. Then, the entire surface of the sacrificial layer 61 is etched back so that the portion filling the inside of the PC 14a remains, exposing the conductive layer 14 between adjacent PCs 14a. The sacrificial layer 61 is, for example, a silicon nitride film. Alternatively, an undoped polysilicon film may be used as the sacrificial layer 61.

Figure 3C:
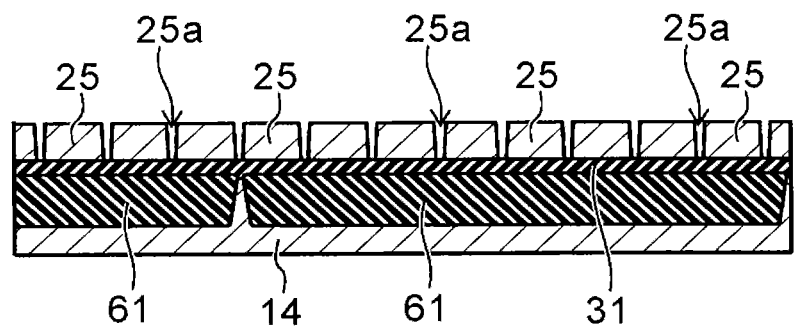

Next, as shown in FIG. 3C, the insulating layer 31 is formed on the conductive layer 14 and the sacrificial layer 61, and the selection gate electrode 25 is formed on the insulating layer 31. The selection gate electrode 25 is, for example, a conductive polysilicon film segmented by a plurality of grooves 25a.

The insulating layer 31 is, for example, a silicon oxide film that is selectively etchable with respect to the sacrificial layer 61. When the sacrificial layer 61 is a silicon nitride film, for example, the silicon oxide film is durable to an etchant (thermal phosphoric acid). The silicon oxide film is durable to an alkaline etchant for selectively etching an undoped polysilicon film. The insulating layer 31 is formed to have a thickness that sets the dielectric voltage between the conductive layer 14 and the selection gate electrode 25 higher than a predetermined value.

Figure 3D:
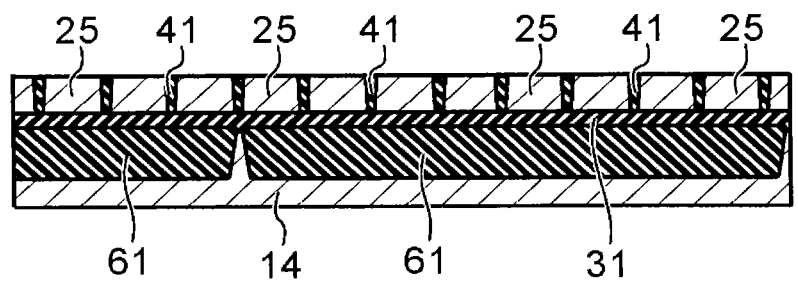

Next, as shown in FIG. 3D, an insulating layer 41 is embedded within the inside of the grooves 25a to insulate adjacent selection gate electrodes 25. For example, the insulating layer 41 is formed on the selection gate electrode 25. Then, the insulating layer 41 is etched back by overall etching to expose the top surface of the selection gate electrode 25. For example, a silicon oxide film may be used for the insulating layer 41.

Then, as shown in FIG. 4A, a stacked body 24 having conductive layers 21 and insulating layers 35 alternately stacked is formed on the selection gate electrode 25. The conductive layer 21 is, for example, a conductive polysilicon oxide film. The insulating layer 35 includes at least one of, for example, a silicon oxide film and a silicon nitride film. The insulating layer 35 is formed to have a thickness that has a withstand voltage higher than the voltage to be applied between the control gate electrodes 21a and between the control gate electrodes 21b.

Next, as shown in FIG. 4B, grooves (hereinafter, ST 24) that segment the stacked body 24 in the Z-direction are formed to form the stacked electrode 20a and the stacked electrode 20b. That is, the ST 24 segment the conductive layer 21 into the control gate electrodes 21a and 21b, and the insulating layer 35 into the insulating layers 35a and 35b.

Next, as shown in FIG. 5A, an insulating film 43 is embedded within the inside of the ST 24. For example, an insulating film 43 is formed on the stacked electrodes 20a and 20b. Then, the insulating film 43 is etched back by overall etching, exposing the top surfaces of the control gate electrodes 21a and 21b. The insulating film 43 includes at least one of a silicon oxide film and a silicon nitride film.

Subsequently, as shown in FIG. 5B, an insulating layer 37 is formed on the stacked electrodes 20a, 20b, and the insulating film 43, and the selection gate electrode 23 is formed on the insulating layer 37. Furthermore, an insulating layer 39 is formed on the selection gate electrode 23. The selection gate electrode 23 is, for example, a conductive polysilicon film. The insulating layer 39 is, for example, a silicon oxide film to protect the selection gate electrode 23. As shown in FIG. 5B, the selection gate electrode 23 and the insulating layer 39 are segmented by a plurality of grooves 23c.

Figure 6A:
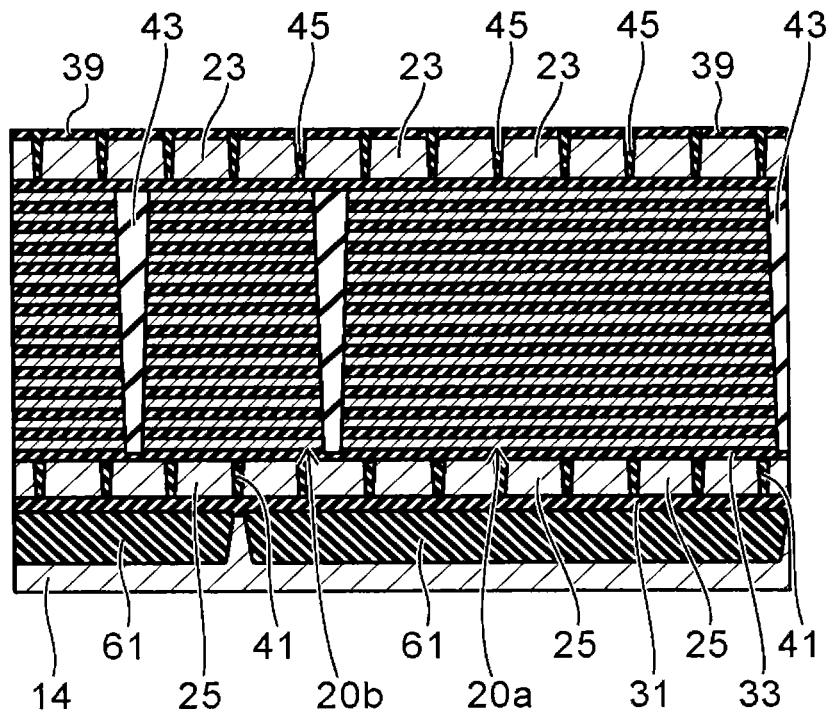

Next, as shown in FIG. 6A, an insulating layer 45 is embedded within the inside of the grooves 23c to insulate adjacent selection gate electrodes 23. For example, the insulating layer 45 is formed on the selection gate electrode 23. Then, the insulating layer 45 is etched back by overall etching to expose the top surface of the selection gate electrode 23. For example, a silicon oxide film may be used for the insulating layer 45.

Figure 6B:
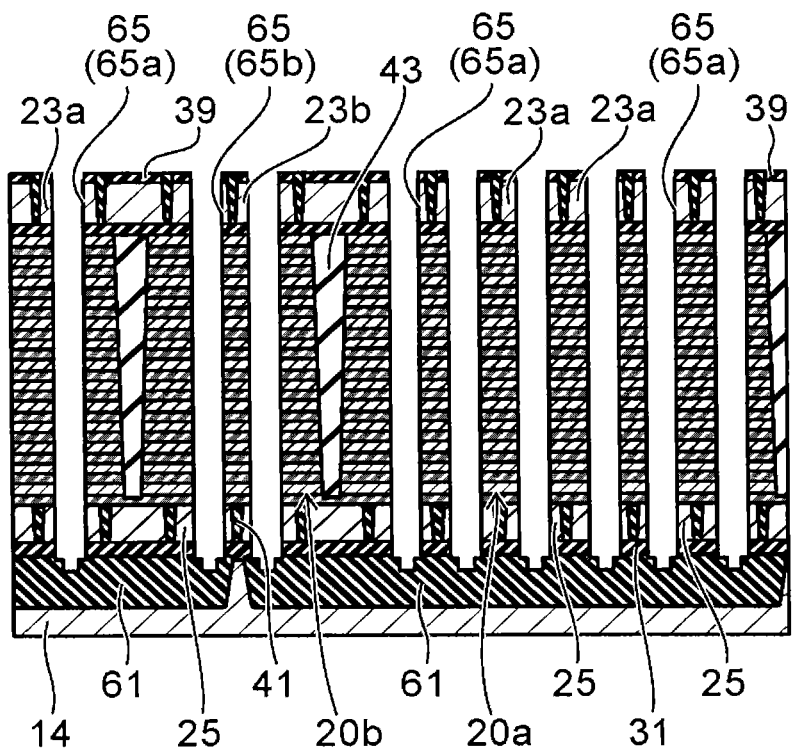

Next, as shown in FIG. 6B, memory holes 65a and 65b are formed. The memory holes 65 pierce the selection gate electrode 23, the stacked electrode 20 and the selection gate electrode 25 from the insulating layer 39 to communicate with the sacrificial layer 61.

Figure 7A:
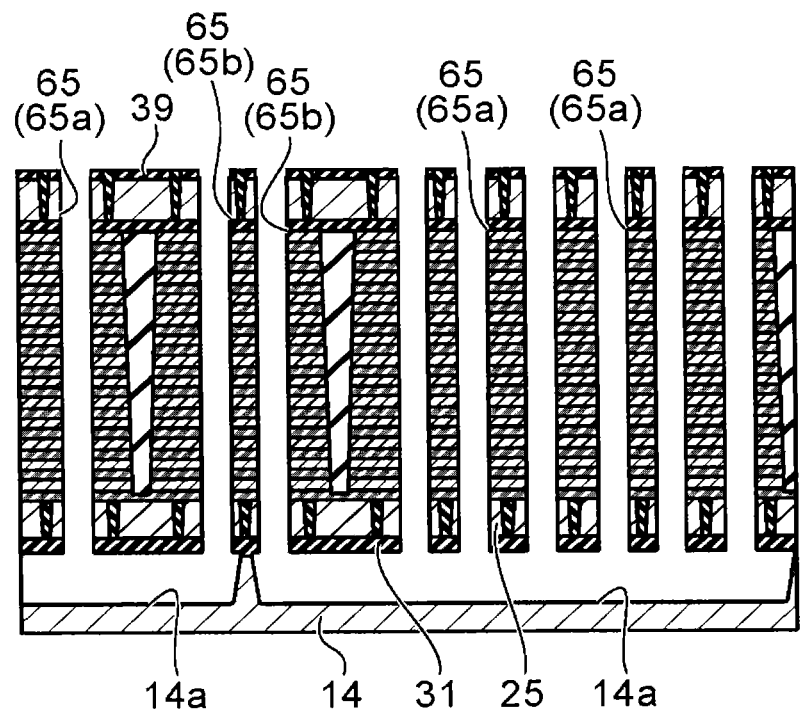

Subsequently, as shown in FIG. 7A, the sacrificial layer 61 is etched via a plurality of memory holes 65 to form the PC 14a. When a silicon nitride film is used as the sacrificial layer 61, for example, a silicon oxide film is used as the insulating layer 35 included in the stacked electrode 20. Then, the sacrificial layer 61 can be selectively etched via the memory holes 65 using a thermal phosphoric acid for an etchant.

Figure 7B:
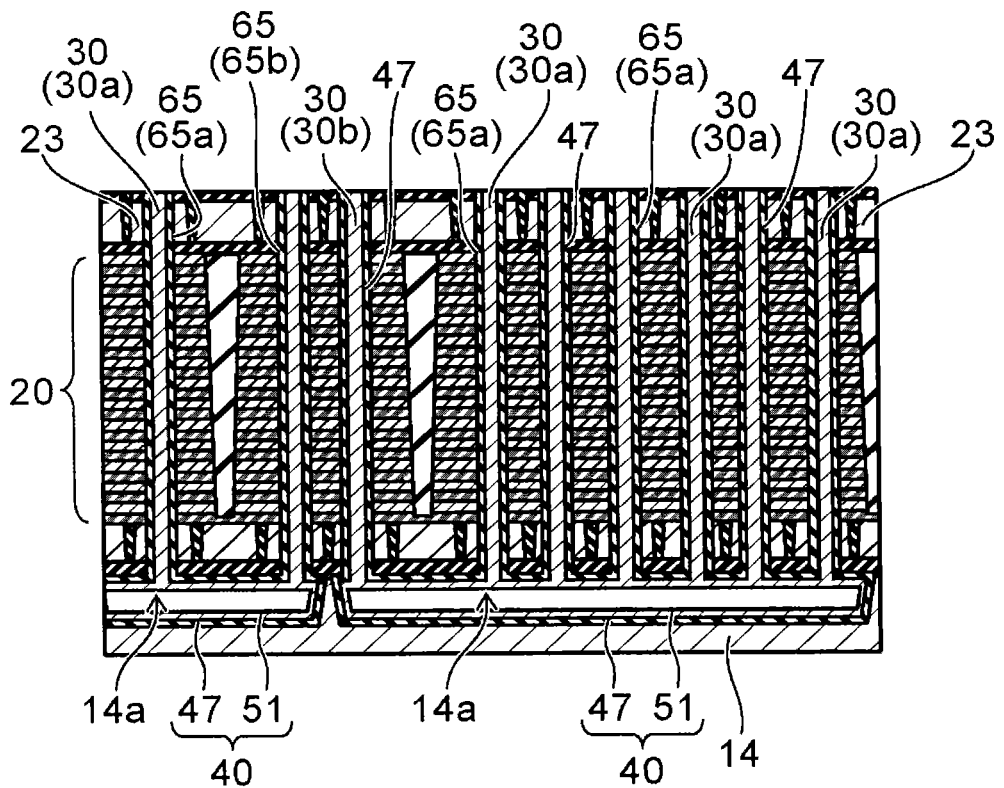

Next, as shown in FIG. 7B, the memory film 47 is formed on the inner surface of the memory holes 65 and the PC 14a. The memory film 47 is, for example, what is called an ONO film having silicon oxide films and silicon nitride films stacked alternately. Then, a conductive layer 51 is formed on the memory film 47 provided on the inner surfaces of the PC 14a, and, at the same time, the semiconductor layer 30 is formed inside the memory holes 65. The semiconductor layer 30 and the conductive layer 51 are, for example, conductive polysilicon films.

For example, a polysilicon film is formed inside the memory holes 65 and the PC 14a communicating therewith using low pressure CVD (Chemical Vapor Deposition). The deposition of the polysilicon film formed inside the PC 14a is stopped when the memory holes 65 are sealed with the polysilicon film. That is, a cavity may be formed inside the PC 14a.

Furthermore, the polysilicon film and the memory film 47 formed on the insulating layer 39 are subjected to overall etching to expose the insulating layer 39. As a result, the semiconductor layers 30a are formed inside the memory holes 65a, and the semiconductor layer 30b is formed inside the memory hole 65b. At the same time, the link parts 40 are formed inside the PC 14a.

Subsequently, multilayer interconnections including the bit lines 60 and the source lines 70 are formed on the end faces of the insulating layer 39 and the semiconductor layer 30 to complete the memory cell array 1 (see FIG. 2).

In the memory cell array 1 according to the embodiment, as described above, a single semiconductor layer 30b connected to the source lines 70 is connected to a plurality of semiconductor layers 30a connected to a single bit line 60 via the link part 40. The array of memory cells included in a plurality of semiconductor layers 30a is controlled by the stacked electrode 20a. Accordingly, the X-directional width, $W_E$, of the stacked electrode 20a (see FIG. 4B) can be formed wide.

Figure 10:
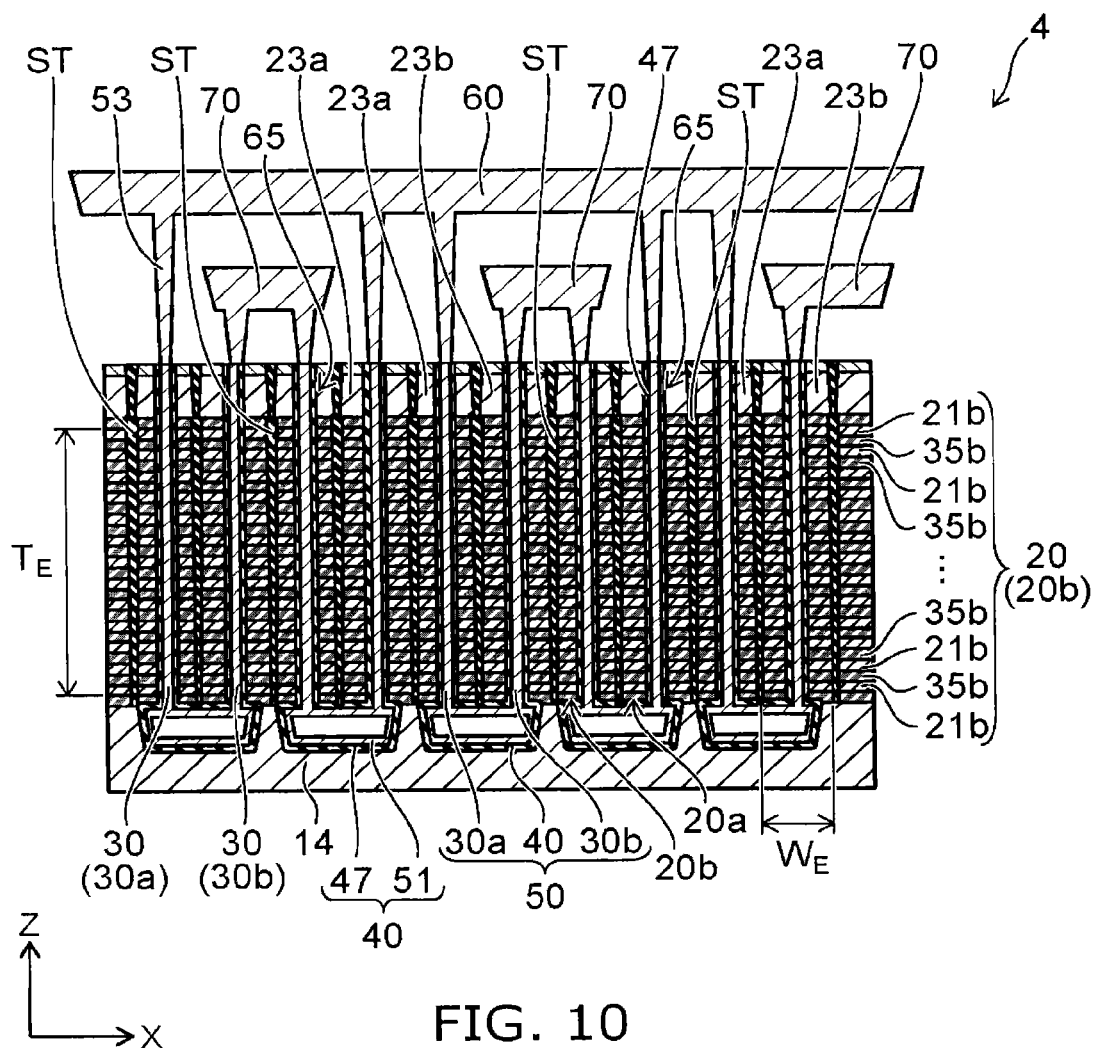
FIG. 10 is a cross-sectional view showing a memory cell array according to a comparative example.

FIG. 10 is a cross-sectional view showing a memory cell array 4 according to a comparative example. In this example, semiconductor layers 30a to be connected to bit lines 60 and semiconductor layers 30b to be connected to source lines 70 are provided in one-to-one correspondence, and link parts 40 that connect between the semiconductor layers 30a and the semiconductor layers 30b are provided to form memory cell strings 50. According to the configuration, isolation grooves ST are provided between the semiconductor layers 30. As a result, memory holes 65 provided on the stacked electrode 20 and the isolation grooves ST are arranged close to each other, making it difficult to avoid interference between the memory holes 65 and the isolation grooves ST. Accordingly, delicate control on the shapes of the memory holes is needed. Furthermore, severe precision is needed for alignment in photolithography in the process of forming the memory holes 65 and the isolation grooves ST.

Further, the width $W_E$ of the stacked electrode 20 is set equal to the pitch of the adjacent semiconductor layers 30, which is, for example, close to the limit of the resolution of photolithography. When the width $W_E$ of the stacked electrode 20 becomes narrower, the aspect ratio of the stacked electrode 20 (Z-directional height $T_E$/X-directional width $W_E$) becomes larger, so that the stacked electrode 20 may be broken during the manufacturing process after the formation of the isolation grooves ST.

According to the embodiment, by contrast, the isolation grooves ST are not provided on the stacked electrode 20a which a plurality of semiconductor layers 30a pierces, so that the width $W_E$ of the stacked electrode 20a can be formed wide. Furthermore, the reduction in the number of the isolation grooves ST can widen the width of the isolation grooves ST without decreasing the storage capacity. In addition, the width $W_E$ of the stacked electrode 20b which the semiconductor layer 30b pierces can be set wide.

Accordingly, interference between the memory holes and isolation grooves is suppressed, making it easier to manufacture the memory cell array. Because the aspect ratio of the stacked electrode 20 can be reduced, the stacked electrode 20 is not easily broken after the formation of the isolation grooves ST. Therefore, the number of control gate electrodes 21a to be stacked can be increased, permitting the storage capacity to be increased.

Although the semiconductor layer 30b to be connected to the source lines 70 are connected to first ends of the link parts 40 according to the embodiment, the embodiment is not limited to this particular configuration. The layout position of the semiconductor layer 30b is optional, and may be set according to the configuration of the memory cell array.

Figure 8:
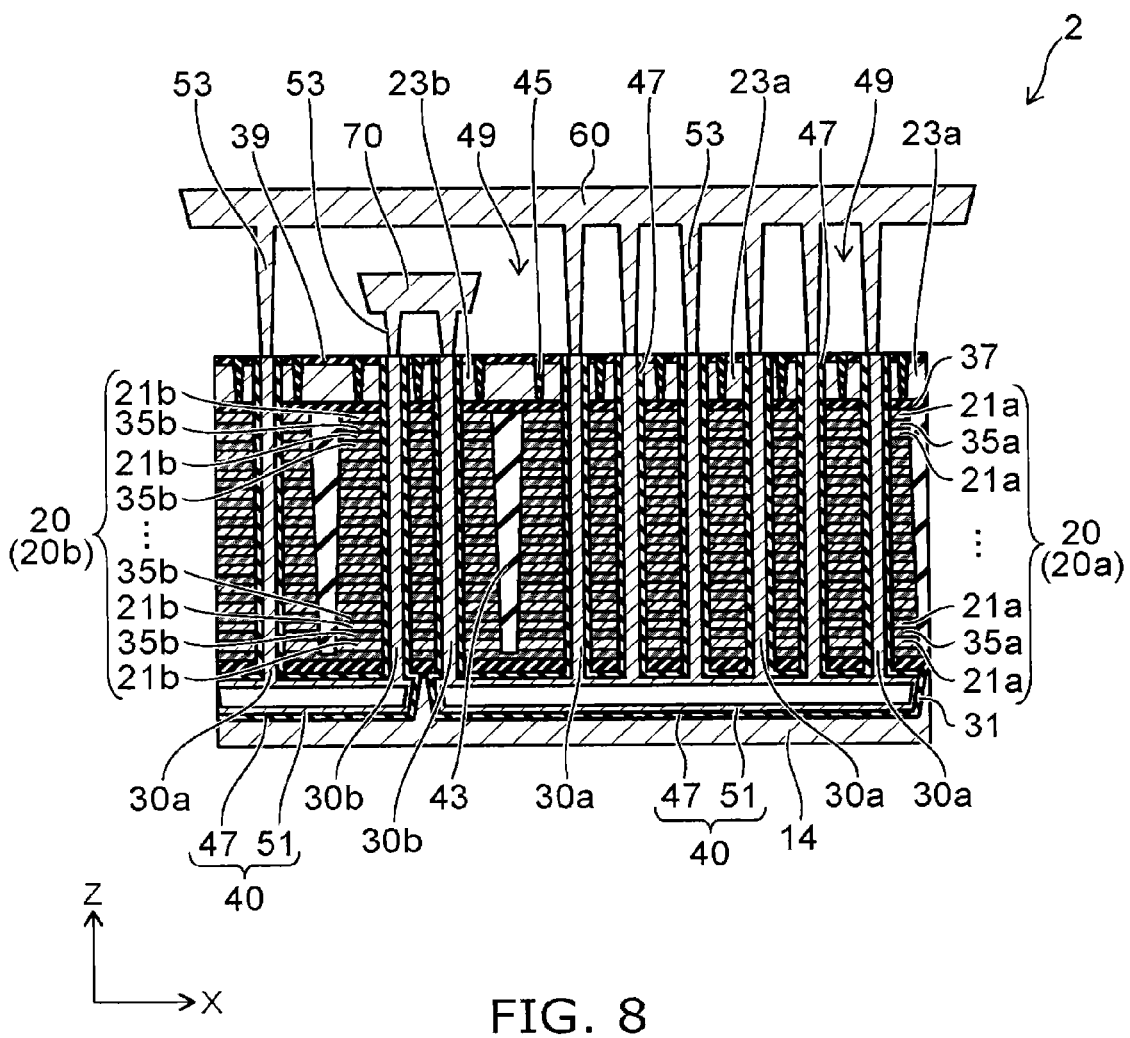
FIG. 8 is a cross-sectional view showing a memory cell array according to a variation of the embodiment.

FIG. 8 is a cross-sectional view showing a memory cell array 2 according to a variation of the embodiment. As shown in FIG. 8, a plurality of semiconductor layers 30a connected to a single bit line 60 is also connected via the link parts 40 to the semiconductor layer 30b connected to the source lines 70 according to the variation. One of the plurality of semiconductor layers 30a is selected by the selection gate electrode 23a provided on the stacked electrode 20a.

In the variation, the selection gate electrode 25 is not provided between the conductive layer 14 and the stacked electrode 20. Therefore, read disturb may occur at other semiconductor layers 30a that are not selected by the selection gate electrode 23a. That is, at the time data is read from the memory cell string 50 including the semiconductor layers 30a and the semiconductor layer 30b, a voltage is also applied to the semiconductor layer 30a that is not selected by the selection gate electrode 23. If the number of the semiconductor layers 30a to be connected to the semiconductor layer 30b via the link part 40 is small, the influence of read disturb can be suppressed. According to the variation, the manufacturing process can be simplified by omitting the selection gate electrode 25, contributing to an increase in manufacturing yield and cost reduction.

Figure 9:
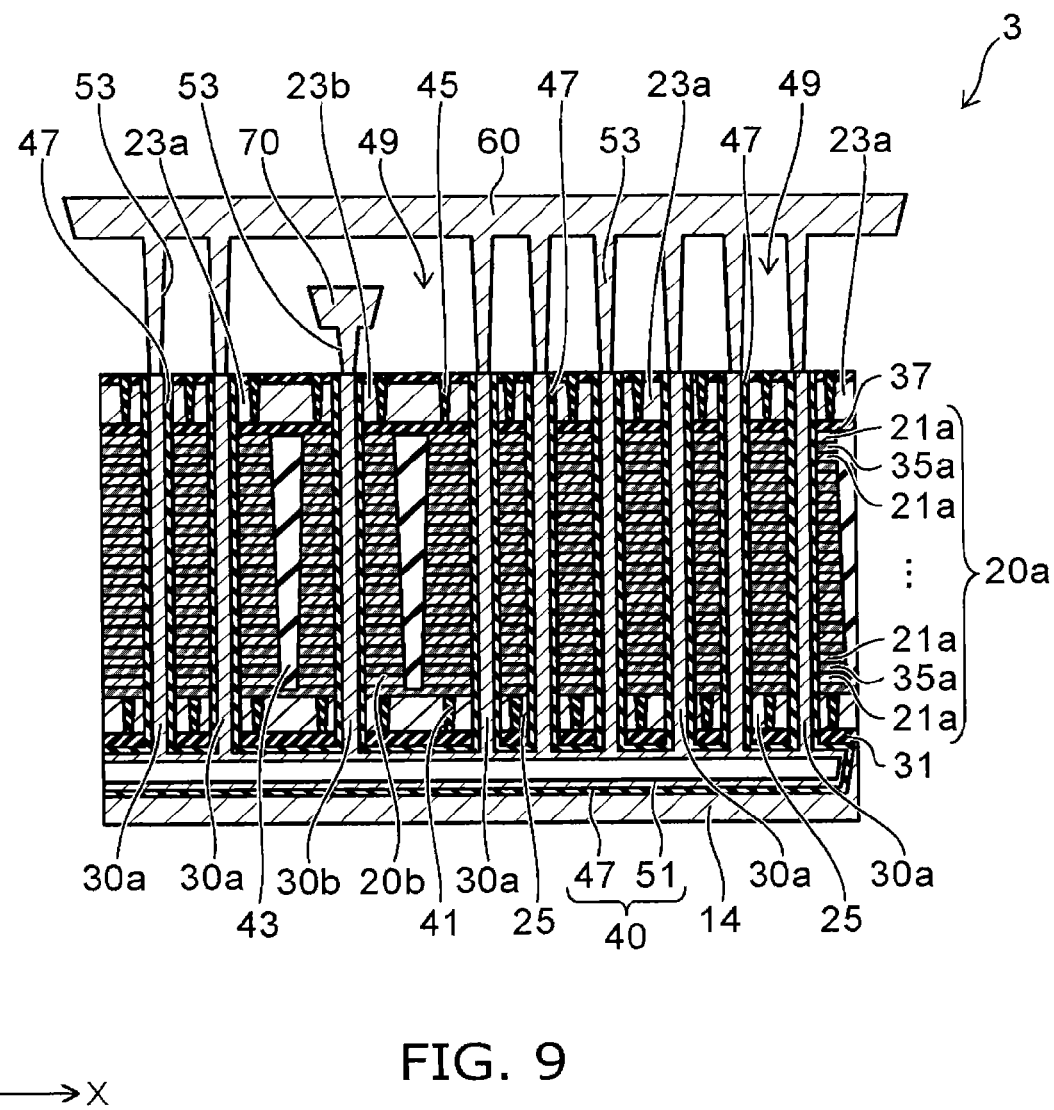
FIG. 9 is a cross-sectional view showing a memory cell array according to another variation of the embodiment.

FIG. 9 is a cross-sectional view showing a memory cell array 3 according to another variation of the embodiment.

In the variation, the semiconductor layer 30b electrically connected to the source lines 70 is connected to the link part 40 between a plurality of semiconductor layers 30a connected to a single bit line 60 and a single link part 40. When the number of the semiconductor layers 30a to be connected to the link part 40 is large, for example, the link part 40 is formed to extend long. The positions of connection of the semiconductor layer 30b, however, may be set as needed according to the layout of the source lines 70.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
an underlying layer having a top surface;
a first stacked electrode provided above the underlying layer;
a second stacked electrode juxtaposed with the first stacked electrode above the underlying layer;
a first semiconductor layer extending through the first stacked electrode in a first direction perpendicular to the top surface of the underlying layer, the first semiconductor layer having a first top end and a first bottom end;
a second semiconductor layer extending through the first stacked electrode in the first direction, the second semiconductor layer having a second top end and second bottom end;
a third semiconductor layer extending through the first stacked electrode, the third semiconductor layer having a third top end and a third bottom end;
a fourth semiconductor layer extending through the second stacked electrode in the first direction, the fourth semiconductor layer having a fourth top end and a fourth bottom end;
a memory film provided between the first stacked electrode and the first semiconductor layer;
a link part provided between the underlying layer and the first stacked electrode, and between the underlying layer and the second stacked electrode, the link part being electrically connected to the first bottom end of the first semiconductor layer, the second bottom end of the second semiconductor layer, the third bottom end of the third semiconductor layer, and the fourth bottom end of the fourth semiconductor layer;
a first interconnection electrically connected to the first top end of the first semiconductor layer, the second top end of the second semiconductor layer, and the third top end of the third semiconductor layer;
a second interconnection electrically connected to the fourth top end of the fourth semiconductor layer; and
a conductive layer covering the link part.

2. The device according to claim 1, further comprising:
a first control electrode provided between the first stacked electrode and the first interconnection, the first control electrode facing the first semiconductor layer via an insulating film; and
a second control electrode provided between the first stacked electrode and the link part, the second control electrode facing the first semiconductor layer via the memory film to control electric conduction of the first semiconductor layer.

3. The device according to claim 2, wherein the first control electrode and the second control electrode include conductive polycrystalline silicon.

4. The device according to claim 1, wherein the conductive layer is provided between the underlying layer and each of the first stacked electrode and the second stacked electrode, and the conductive layer covers the link part via the memory film.

5. The device according to claim 4, wherein the conductive layer includes polycrystalline silicon.

6. The device according to claim 1, further comprising an insulating film provided between the first stacked electrode and the second stacked electrode to electrically insulate the second stacked electrode from the first stacked electrode.

7. The device according to claim 6, wherein the insulating film includes at least one of a silicon oxide film and a silicon nitride film.

8. The device according to claim 2, further comprising a third control electrode provided between the second stacked electrode and the second interconnection, the third control electrode facing the fourth semiconductor layer via an insulating film.

9. The device according to claim 8, wherein the third control electrode includes conductive polycrystalline silicon.

10. The device according to claim 1, wherein each of the first stacked electrode and the second stacked electrode includes a plurality of control gate electrodes and an insulating layer provided between the control gate electrodes, and the control gate electrodes are stacked in the first direction.

11. The device according to claim 10, wherein the control gate electrodes include conductive polycrystalline silicon, and
the insulating layer includes at least one of a silicon oxide film and a silicon nitride film.

12. The device according to claim 1, wherein the memory film is a multilayer film including a silicon oxide film and a silicon nitride film.

13. The device according to claim 1, wherein the link part and each of the first semiconductor layer, the second semiconductor layer, the third semiconductor layer, and the fourth semiconductor layer include polycrystalline silicon.

14. The device according to claim 1, wherein the memory film is provided between the second stacked electrode and the fourth semiconductor layer.

15. The device according to claim 1, wherein the first semiconductor layer, the second semiconductor layer, the third semiconductor layer, and the fourth semiconductor layer overlap the conductive layer in the first direction.

16. The device according to claim 1, wherein the conductive layer surrounds the link part and covers a bottom surface of the link part, and does not cover a top surface of the link part.

17. The device according to claim 1, further comprising:
a third stacked electrode juxtaposed with the second stacked electrode above the underlying layer;
a fifth semiconductor layer extending through the third stacked electrode in the first direction, the fifth semiconductor layer having a fifth top end and a fifth bottom end; and
another link part provided between the underlying layer and the second stacked electrode, and between the underlying layer and the third stacked electrode, the another link part being electrically connected to the fifth bottom end of the fifth semiconductor layer, and the conductive layer covering the another link part.

18. The device according to claim 17, wherein
the fifth top end of the fifth semiconductor layer is electrically connected to the first interconnection.

19. The device according to claim 17, further comprising:
a sixth semiconductor layer extending through the second stacked electrode in the first direction, the sixth semiconductor layer having an sixth top end and a sixth bottom end, the sixth bottom end of the sixth semiconductor layer being electrically connected to the another linked part.

20. The device according to claim 19, wherein
the sixth top end of the sixth semiconductor layer is electrically connected to the second interconnection.

21. The device according to claim 18, further comprising:
a first control electrode provided between the first stacked electrode and the first interconnection, the first control electrode facing the first semiconductor layer via an insulating film;
a second control electrode provided between the first stacked electrode and the link part, the second control electrode facing the first semiconductor layer via the memory film;
a third control electrode provided between the second stacked electrode and the second interconnection, the third control electrode facing the fourth semiconductor layer via an insulating film;
a fourth control electrode provided between the third stacked electrode and the first interconnection, the fourth control electrode facing the fifth semiconductor layer via an insulating film; and
a fifth control electrode provided between the third stacked electrode and the another link part, the fifth control electrode facing the fifth semiconductor layer via the memory film.

22. The device according to claim 1, wherein the link part includes a conductive layer that is hollow.

* * * * *